United States Patent
Itou et al.

(10) Patent No.: US 6,934,204 B2
(45) Date of Patent: Aug. 23, 2005

(54) SEMICONDUCTOR DEVICE WITH REDUCED TERMINAL INPUT CAPACITANCE

(75) Inventors: Takashi Itou, Hyogo (JP); Yasuhiko Tsukikawa, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 540 days.

(21) Appl. No.: 10/140,196

(22) Filed: May 8, 2002

(65) Prior Publication Data

US 2003/0101374 A1 May 29, 2003

(30) Foreign Application Priority Data

Nov. 29, 2001 (JP) ........................................ 2001-364369

(51) Int. Cl.[7] ................................................ G11C 7/00
(52) U.S. Cl. ................... 365/201; 365/200; 365/185.24
(58) Field of Search ................................ 365/201, 200, 365/185.24

(56) References Cited

U.S. PATENT DOCUMENTS 4,812,680 A * 3/1989 Kawashima et al. ........ 307/350
4,833,341 A * 5/1989 Watanabe et al. ......... 307/296.1
4,937,700 A * 6/1990 Iwahashi ..................... 361/56
5,694,364 A 12/1997 Morishita et al.

FOREIGN PATENT DOCUMENTS

| JP | 7-74318 | 3/1995 |
| JP | 10-21699 | 1/1998 |
| KR | 2000-887 | 1/2000 |

\* cited by examiner

Primary Examiner—Connie C. Yoha
(74) Attorney, Agent, or Firm—McDermott Will & Emery LLP

(57) ABSTRACT

A P-channel MOS transistor is provided between a terminal and an SVIH detection circuit for performing test mode detection. The P-channel MOS transistor is rendered non-conductive when a potential supplied to the terminal that is used commonly for signal input during the test setting and the normal operation is a power-supply potential EXTVDD or below. The SVIH detection circuit detects that a test mode is to be set when the potential at the terminal becomes higher than a prescribed potential. During the normal operation, the terminal is disconnected from the SVIH detection circuit so that the input capacitance of the terminal can be made to be about the same as that of another input terminal, and a high speed operation becomes possible. Moreover, there is no need to take into account the parasitic capacitance of an interconnection line leading to the SVIH detection circuit.

14 Claims, 7 Drawing Sheets

SEMICONDUCTOR DEVICE WITH REDUCED TERMINAL INPUT CAPACITANCE

BACKGROUND OF THE INVENTION

1. Field of the Invention

The present invention relates to a semiconductor device having a test mode and a normal mode as operating modes, and more specifically, to a semiconductor device that employs a higher input level in the test mode than in the normal mode.

2. Description of the Background Art

In some cases, a semiconductor device such as a dynamic random access memory (DRAM) and the like has a super VIH level applied at a terminal in order to set the semiconductor device to a test mode. The super VIH level is a high potential level that is greater than the logic high or H level that is employed when the operating mode is the normal mode. For instance, in the semiconductor device which utilizes a power-supply voltage of 3.3V, the super VIH level would be about 5V. When the super VIH level is applied to a prescribed input terminal, the semiconductor device is set to the test mode.

The reason for purposely applying the super VIH level to a terminal to set the device to the test mode is that there is the fear of a user erroneously setting the device to the test mode if a simple command input alone is required to set the test mode.

By performing the detection of the super VIH level, the test mode would never be readily entered into as long as the user complies with the conditions of the input voltage so that the stable operation in the normal mode would be achieved.

FIG. 10 is a schematic diagram related to the description of an arrangement for detecting the super VIH level of a conventional double data rate synchronous dynamic random access memory (DDR SDRAM).

Referring to FIG. 10, a terminal T1 to which a bank address signal BA1 is supplied is connected to an address buffer 4a by an interconnection line W1. Interconnection line W1 has a parasitic resistance R1 and a parasitic capacitance C1. Interconnection line W1 is connected to a control circuit 508 by an international line W2. Interconnection line W2 has a parasitic resistance R2 and a parasitic capacitance C2.

Control circuit 508 includes an SVIH detection circuit 22 for detecting that a super VIH level is supplied to terminal T1, and a test mode circuit 24 activated according to an output from SVIH detection circuit 22 for outputting test signals TE0 to TEk according to combinations of internal address signals INTA0 to INTAn.

When the potential supplied to terminal T1 is 3.3V or below, for instance, SVIH detection circuit 22 does not recognize the input voltage as the super VIH level. Thus, during the normal operation, an input signal supplied to terminal T1 is only used as bank address signal BA1. Bank address signal BA1 is input to address buffer 4a. Address buffer 4a outputs an internal address signal INTBA1. Internal address signal INTBA1 is used for the designation of a memory bank along with an internal address signal INTBA0 supplied via another terminal.

On the other hand, when the potential supplied to terminal T1 is 5V or greater, for instance, SVIH detection circuit 22 recognizes the input potential to be the super VIH level. In this case, SVIH detection circuit 22 activates test mode circuit 24. Test mode circuit 24 outputs test signals TE0 to TEk according to combinations of internal address signals INTA0 to INTAn. A variety of tests are designated by test signals TE0 to TEk, and a circuit provided with an activated test signal attains the state in which a prescribed test operation is possible. One example of the prescribed test operation is a power supply-related test.

As higher speeds of semiconductor devices are achieved, the restriction of the capacitance that is parasitic on a terminal becomes strict. When the parasitic capacitance of the terminal is great, the transmission of an input signal becomes slow. In addition, a higher drivability would be required of a device which outputs a signal in order to drive the terminal, which results in the increase in noise and in power consumption.

In a DDR SDRAM, for instance, an input capacitance of an address input terminal is required to be about 2 pF to 3 pF. The parasitic capacitance of the terminal results from a parasitic capacitance of an interconnection line connected to the terminal, capacitances of a gate, a drain, and a source of a transistor, and so on. As shown in FIG. 10, parasitic capacitances C1, C2 are added to terminal T1 to which bank address BA1 is input. In order to achieve a high speed operation, parasitic capacitance C2 should be made as small as possible. In order to prevent parasitic capacitance C2 from becoming large, an interconnection line has to be 2 mm or shorter, for instance. Thus, there is the restriction that SVIH detection circuit 22 must be disposed in the vicinity of an input pad.

Moreover, as opposed to terminal T1, other input terminals, such as a terminal to which bank address BA0 is to be input, for instance, do not have interconnection lines corresponding to interconnection line W2 connected to them, so that their parasitic capacitances would become C1. Consequently, problems arise in that the parasitic capacitances would differ according to the terminals and that the timing of signal input to an internal circuit would differ. In addition, an output terminal may be set to a disable state so as to allow the recognition of the super VIH level; however, there is a possibility of an output signal being delayed if an unnecessary additional capacitance is added to the output terminal.

SUMMARY OF THE INVENTION

The object of the present invention is to provide a semiconductor device that is capable of keeping a parasitic capacitance of a terminal small as well as of using a terminal for test mode setting also as a terminal for use during a normal operation.

In short, the present invention is a semiconductor device having a normal mode and a test mode as operating modes and including a terminal, an internal circuit, a test mode detection circuit, and a switch circuit.

The internal circuit receives from a terminal a signal that is within the range of an input potential in the normal mode. The test mode detection circuit detects that the potential of the terminal is a test setting potential outside the range of the input potential when setting to the test mode. The switch circuit is provided between the terminal and the test mode detection circuit, is rendered conductive when the potential of the terminal reaches a prescribed potential outside the range of the input potential, and transmits a signal corresponding to the potential of the terminal to the test mode detection circuit.

Therefore, the main advantage of the present invention is that an input capacitance of a terminal to which the test mode detection circuit is connected can be made approximately equal to an input capacitance of another terminal so that a high speed operation becomes possible. Moreover, the restriction of the position for disposing the test mode detection circuit is eliminated so that the layout can be optimized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
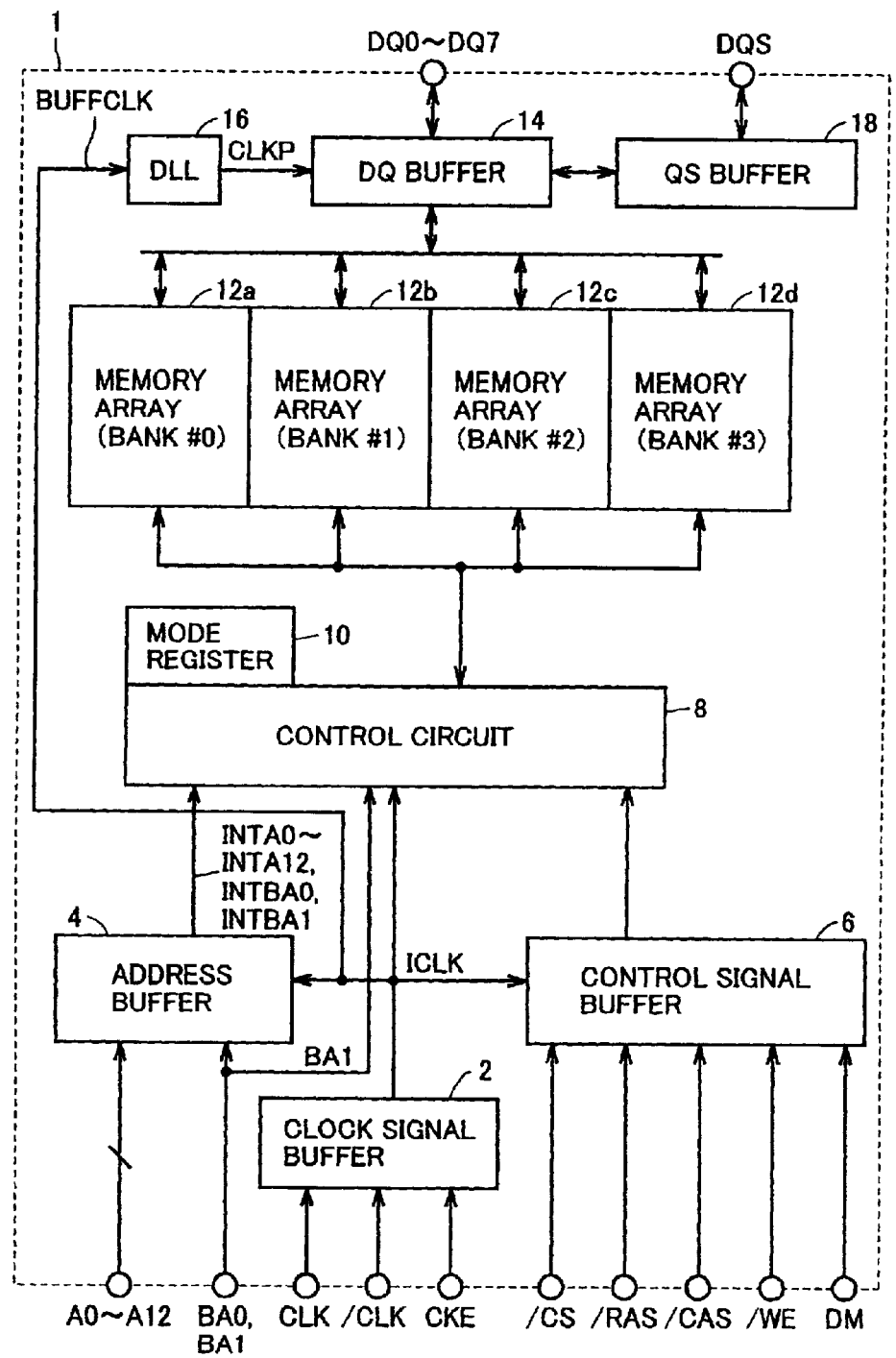
FIG. 1 is a schematic block diagram showing an arrangement of a semiconductor device 1 of the present invention.

The embodiments of the present invention will be described in detail below with reference to the drawings. Throughout the drawings, the same reference characters denote the same or corresponding parts.

First Embodiment

FIG. 1 is a schematic block diagram showing an arrangement of a semiconductor device 1 of the present invention. Specifically, semiconductor device 1 illustrated in the embodiment is a DDR SDRAM. The present invention, however, can be applied not only to a semiconductor memory device but also to a semiconductor device that needs to be set to a test mode and that requires an input terminal capacitance to be limited to a small amount.

Referring to FIG. 1, semiconductor device 1 includes an address buffer 4 for receiving external address signals A0 to A12 and bank address signals BA0, BA1 to generate internal address signals INTA0 to INTA12, INTBA0, and INTBA1, a clock signal buffer 2 for receiving external clock signals CLK, /CLK, and a clock enable signal CKE to generate an internal clock signal ICLK, and a control signal buffer 6 for taking in a chip select signal/CS, a row address strobe signal/RAS, a column address strobe signal/CAS, a write enable signal/WE, and an input mask signal DM based on internal clock signal ICLK.

Semiconductor device 1 further includes a control circuit 8 for receiving an output from control signal buffer 6, internal clock signal ICLK, and internal address signals INTA0 to INTA12, INTBA0, and INTBA1 to perform the control of the entire chip, and a mode register 10 for holding according to an instruction from control circuit 8 an operating mode information of the SDRAM.

Although not shown, control circuit 8 includes an SVIH detection circuit for performing detection of a test mode as will be described later and a test mode circuit for outputting a test signal to each block when the test mode is detected.

Semiconductor device 1 further includes a DQ buffer 14 for communicating a data signal with an external data bus, and memory arrays 12a to 12d each having a plurality of memory cells arranged in a matrix of rows and columns for holding data externally input. Memory arrays 12a to 12d are four banks #0 to #3, each of which is capable of operating independently.

Semiconductor device 1 further includes a DLL circuit 16 for receiving internal clock signal ICLK from clock signal buffer 2 as a clock signal BUFFCLK to output a clock signal CLKP to DQ buffer 14, and a QS buffer 18 for outputting a strobe signal DQS according to a control timing of DQ buffer 14.

Figure 2:
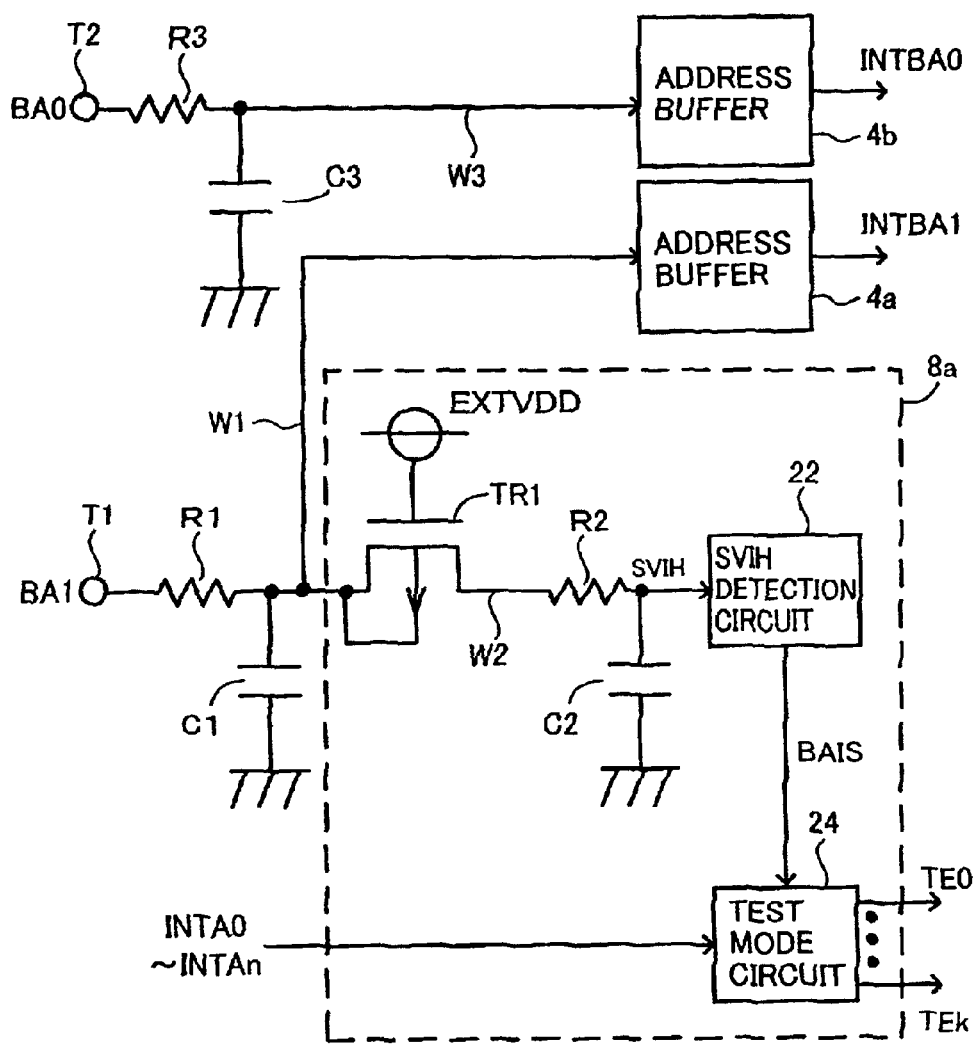
FIG. 2 is a schematic diagram related to the description of an arrangement for detecting a super VIH level in semiconductor device 1 shown in FIG. 1.

FIG. 2 is a schematic diagram related to the description of an arrangement for detecting a super VIH level in semiconductor device 1 shown in FIG. 1.

Referring to FIG. 2, a terminal T1 to which bank address signal BA1 is supplied is connected to an address buffer 4a by an interconnection line W1. Interconnection line W1 has a parasitic resistance R1 and a parasitic capacitance C1. Parasitic resistance R1 and parasitic capacitance C1 are not elements that are actually disposed with a purpose so that they are not usually shown in a circuit diagram. FIG. 2, however, is represented as a circuitry equivalent to the actual device to facilitate understanding, and indicates the symbols for parasitic resistance R1 and parasitic capacitance C1.

A terminal T2 to which bank address signal BA0 is supplied is connected to an address buffer 4b by an interconnection line W3. Interconnection line W3 has a parasitic resistance R3 and a parasitic capacitance C3. Parasitic resistance R3 and parasitic capacitance C3 are not elements that are actually disposed with a purpose so that they are not usually shown in a circuit diagram. FIG. 2, however, is represented as a circuitry equivalent to the actual device to facilitate understanding, and indicates the symbols for parasitic resistance R3 and parasitic capacitance C3.

In addition, address buffers 4a, 4b are circuits included in address buffer 4 in FIG. 1. Moreover, a control circuit 8a is a circuit included as a part of control circuit 8 in FIG. 1.

Control circuit 8a includes a P-channel MOS transistor TR1 connected between interconnection line W1 and interconnection line W2 for receiving a power-supply potential EXTVDD at a gate, an SVIH detection circuit 22 for detecting a signal SVIH when a super VIH level is supplied at terminal T1, and a test mode circuit 24 that is activated according to an output signal BALS from SVIH detection circuit 22 for outputting test signals TE0 to TEk according to combinations of internal address signals INTA0 to INTAn.

P-channel MOS transistor TR1 and SVIH detection circuit 22 are connected by interconnection line W2. Interconnection line 2 has a parasitic resistance R2 and a parasitic capacitance C2. Parasitic resistance R2 and parasitic capacitance C2 are not elements that are actually disposed with a purpose so that they are not usually shown in a circuit diagram. FIG. 2, however, is represented as a circuitry equivalent to the actual device to facilitate understanding, and indicates the symbols for parasitic resistance R2 and parasitic capacitance C2.

Figure 3:
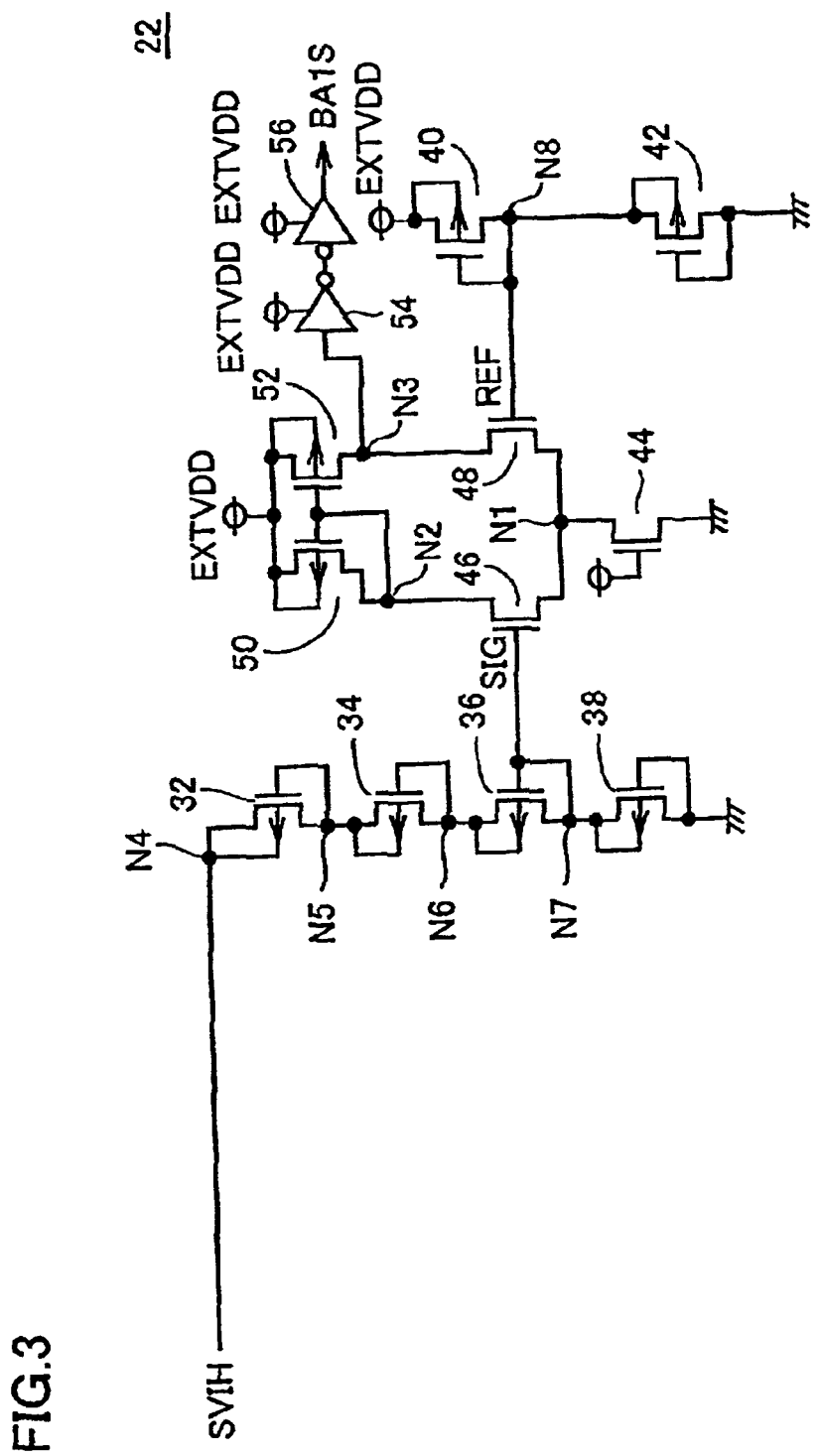
FIG. 3 is a circuit diagram showing an arrangement of an SVIH detection circuit 22 in FIG. 2.

FIG. 3 is a circuit diagram showing an arrangement of SVIH detection circuit 22 in FIG. 2.

Referring to FIG. 3, SVIH detection circuit 22 includes a P-channel MOS transistor 32 connected between a node N4 for receiving signal SVIH and a node N5, a P-channel MOS transistor 34 connected between node N5 and a node N6, a P-channel MOS transistor 36 connected between node N6 and a node N7, and a P-channel MOS transistor 38 connected between node N7 and a ground node.

Transistor 32 has a gate connected to node N5 and a backgate connected to node N4. Transistor 34 has a gate connected to node N6 and a backgate connected to node N5. Transistor 36 has a gate connected to node N7 and a backgate connected to node N6. Transistor 38 has a gate connected to the ground node and a backgate connected to node N7.

A signal SIG having a signal level that is about a one-fourth of the signal level of signal SVIH is output from node N7.

SVIH detection circuit 22 further includes a P-channel MOS transistor 40 that is connected between a node for receiving power-supply potential EXTVDD and a node N8 and a P-channel MOS transistor 42 connected between node N8 and a ground node.

Transistor 40 has a gate connected to node N8 and a backgate connected to power-supply potential EXTVDD. Transistor 42 has a gate connected to the ground node and a backgate connected to node N8.

A signal REF having a signal level that is about a half of power-supply potential EXTVDD is output from node N8.

SVIH detection circuit 22 further includes an N-channel MOS transistor 44 connected between a ground node and a node N1 and having a gate coupled to a power-supply potential EXTVDD, an N-channel MOS transistor 46 connected between node N1 and a node N2 for receiving signal SIG at a gate, and an N-channel MOS transistor 48 connected between node N1 and a node N3 for receiving signal REF at a gate.

SVIH detection circuit 22 further includes a P-channel MOS transistor 50 connected between node N2 and a power-supply node for receiving a power-supply potential EXTVDD and having a gate connected to node N2, a P-channel MOS transistor 52 connected between node N3 and the power-supply node for receiving power-supply potential EXTVDD and having a gate connected to node N2, an inverter 54 having an input connected to node N3, and an inverter 56 for receiving and inverting an output from inverter 54 to output signal BA1S. Inverters 54 and 56 receive power-supply potential EXTVDD as an operating power-supply potential.

Transistors 44 to 52 form a comparing circuit which compares signal REF and signal SIG. The level of signal REF is about a half of power-supply potential EXTVDD, while the level of signal SIG is about one-fourth of signal SVIH so that an output of the comparing circuit is inverted when signal SVIH exceeds a value that is approximately two times the power-supply potential EXVDD.

Figure 4:
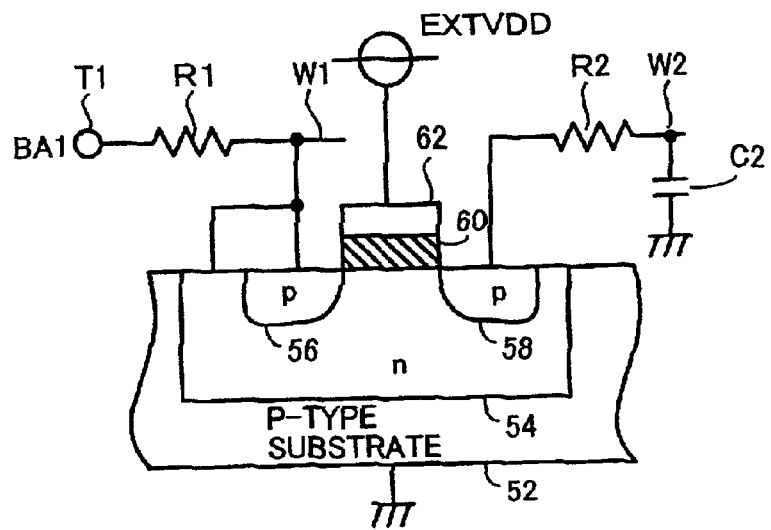
FIG. 4 is a cross sectional view related to the description of a P-channel MOS transistor TR1 of FIG. 2.

FIG. 4 is a cross sectional view related to the description of P-channel MOS transistor TR1 of FIG. 2.

Referring to FIG. 4, P-channel MOS transistor TR1 is formed within an n-well 54 provided on the main surface of a P-type substrate of the semiconductor device. P-channel MOS transistor TR1 includes p-type impurity regions 56, 58, an insulating film 60 formed above the region between p-type impurity regions 56 and 58, and a conductive gate 62 formed above insulating film 60.

Gate 62 is coupled to a power-supply potential EXTVDD. The n-well 54 and p-type impurity region 56 are connected to a terminal T1 for receiving a bank address signal BA1 via a parasitic resistance R1. The p-type impurity region 58 is connected to SVIH detection circuit 22 of FIG. 2 via a parasitic resistance R2.

Figure 5:
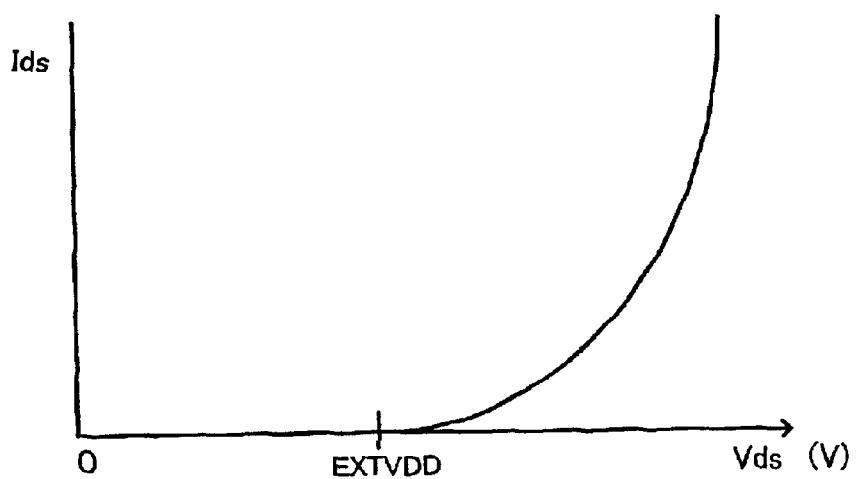
FIG. 5 is a diagram related to the description of electrical properties of P-channel MOS transistor TR1.

FIG. 5 is a diagram related to the description of the electrical properties of P-channel MOS transistor TR1.

Referring to FIGS. 4 and 5, a current does not flow through P-channel MOS transistor TR1 until the potential at terminal T1 exceeds EXTVDD+|Vthp|. When the potential at terminal 1 further rises and exceeds EXTVDD+|Vthp|, a current flows through P-channel MOS transistor TR1. Here, EXTVDD is an externally supplied power-supply potential which is 3.3V, for instance. In addition, Vthp is a threshold voltage of a P-channel MOS transistor and normally has a negative value.

Thus, until the potential at terminal T1 exceeds EXTVDD+|Vthp|, a current does not flow from impurity region 56 to impurity region 58. Consequently, parasitic capacitance C2 of interconnection line W2 connected to impurity region 58 does not contribute to an input capacitance of terminal T1.

Referring back to FIG. 2, an operation of the invention of the first embodiment will be described.

When the potential supplied to terminal T1 is an input potential (for instance 5V or greater) higher than EXTVDD (for instance, 3.3V), the input potential is supplied to the SVIH detection circuit via P-channel MOS transistor TR1. SVIH detection circuit 22 recognizes the input potential as the super VIH level. Accordingly, SVIH detection circuit 22 activates test mode circuit 24.

Test mode circuit 24 outputs test signals TE0 to TEk according to combinations of internal address signals INTA0 to INTAn. A variety of tests are designated by test signals TE0 to TEk, and a circuit to which an activated test signal is supplied attains the state in which a prescribed test operation is possible. One example of the prescribed test operation is a power supply-related test.

On the other hand, when the potential supplied to terminal T1 is power-supply potential EXTVDD (for instance, 3.3V) or below, P-channel MOS transistor TR1 becomes non-conductive as shown in FIG. 5. Consequently, interconnection line W2 becomes disconnected from interconnection line W1.

At this time, SVIH detection circuit 22 does not recognize the input potential as the super VIH level. Therefore, during the normal operation, an input signal supplied to terminal T1 would only be utilized as bank address signal BA1.

Bank address signal BA1 is input to address buffer 4a. Address buffer 4a outputs an internal address signal INTBA1. Internal address signal INTBA1 is used for the designation of a memory bank along with an internal address signal INTBA0 supplied via another terminal T2.

During the normal operation, interconnection line W2 is disconnected from interconnection line W1 by P-channel MOS transistor TR1. Thus, the input capacitance of input terminal T1 during the normal operation approximately equals the sum of parasitic capacitance C1 of interconnection line W1 and the input capacitance of address buffer 4a, and is not affected by parasitic capacitance C2 of interconnection line W2. The input capacitance is measured by applying a bias of, for instance, 1.25V to the terminal. According to the present invention, the result of the measurement shows that parasitic capacitance C2 of interconnection line W2 can be removed.

Moreover, even if interconnection line W2 becomes longer and parasitic capacitance C2 becomes greater, it does not contribute to the input capacitance at terminal T1 so that it is not necessarily required to dispose SVIH detection circuit 22 in the vicinity of terminal T1. There is a need, however, to dispose P-channel MOS transistor TR1 at a position close to a branch point at which interconnection line W2 diverges from interconnection line W1 and to allow most of parasitic capacitance C2 of interconnection line W2 to be cut off.

In the above-described manner, the input capacitance of terminal T1 utilized for the test mode detection can be made to be about the same as the input capacitance of another terminal T2. In addition, the restriction of the position for disposing the SVIH circuit is eliminated. Thus, a semiconductor device can be implemented which is capable of a high speed operation and of achieving layout optimization.

Second Embodiment

Figure 6:
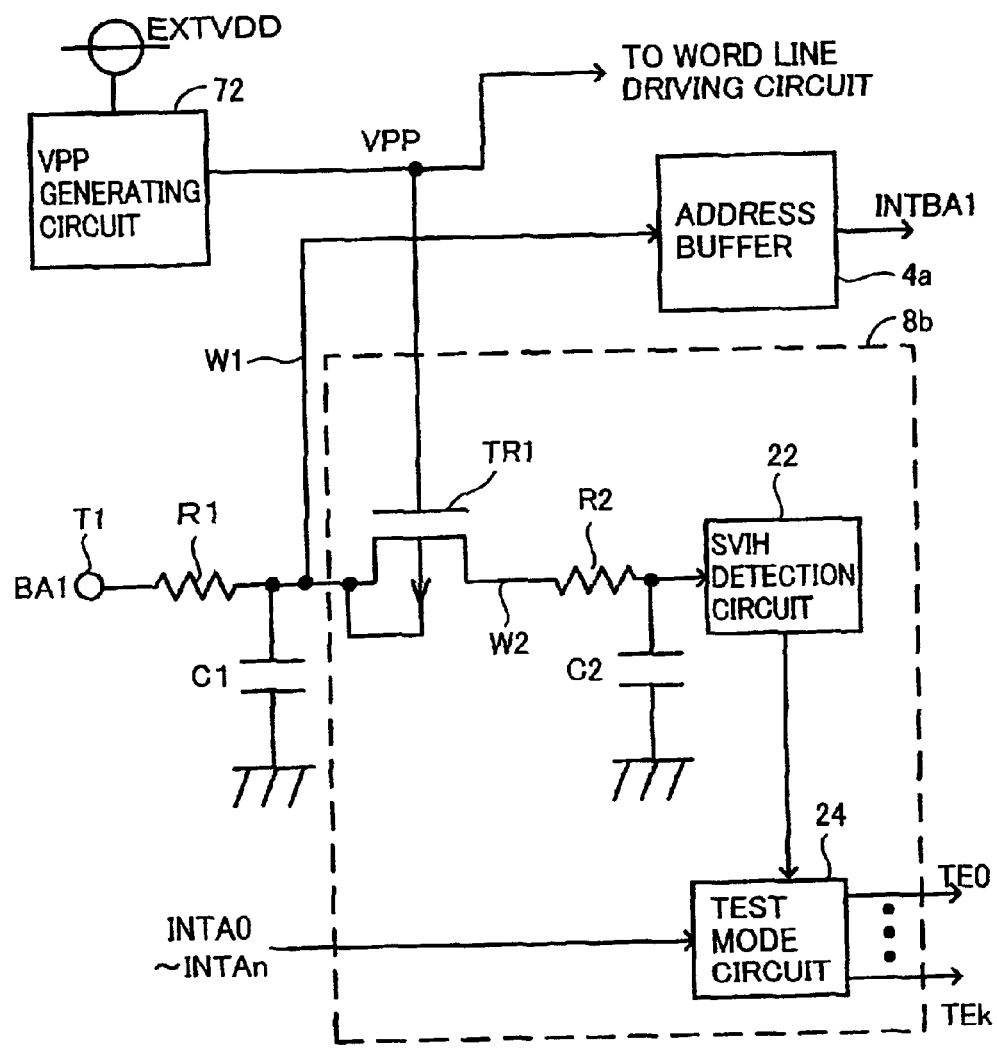
FIG. 6 is a schematic diagram related to the description of an arrangement for detecting the super VIH level of a semiconductor device according to a second embodiment.

FIG. 6 is a schematic diagram related to the description of an arrangement for detecting a super VIH level of a semiconductor device according to the second embodiment.

Referring to FIG. 6, a DRAM, for instance, includes a VPP generating circuit 72 for receiving an external power-supply potential EXTVDD to generate a boosted potential VPP. Boosted potential VPP is used, for instance, as a driving potential of a word line for performing a row selection of a plurality of memory cells arranged in a matrix of rows and columns included in each of memory arrays 12a to 12d of FIG. 1. Boosted potential VPP is supplied from VPP generating circuit 72 to a word line driving circuit.

The semiconductor device according to the second embodiment includes a control circuit 8b in place of control circuit 8a shown in FIG. 2. Control circuit 8b differs from control circuit 8a in that a gate of a P-channel MOS transistor TR1 receives boosted potential VPP. The arrangement of control circuit 8b in other portions is the same as that of control circuit 8a described in relation to FIG. 2 so that the description will not be repeated.

Figure 7:
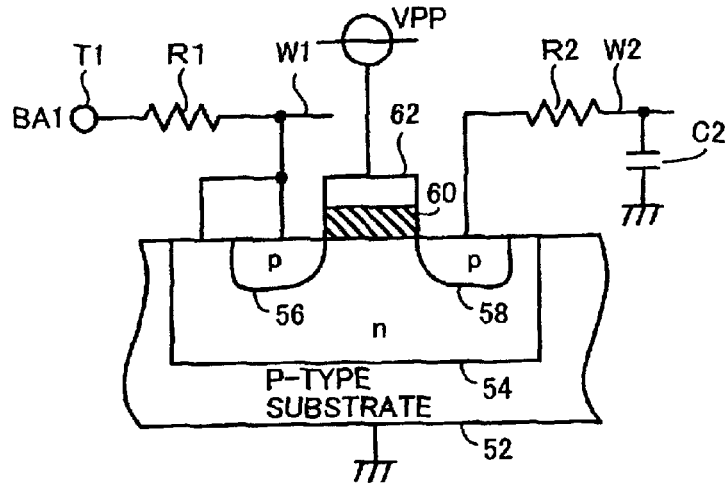
FIG. 7 is a cross sectional view related to the description of a P-channel MOS transistor TR1 of FIG. 6.

FIG. 7 is a cross sectional view related to the description of P-channel MOS transistor TR1 of FIG. 6.

Referring to FIG. 7, in the second embodiment, the gate of P-channel MOS transistor TR1 is coupled to boosted potential VPP that is internally generated. Other portions are the same as FIG. 4 so that the description will not be repeated.

A current does not flow through P-channel MOS transistor TR1 until the potential at a terminal T1 exceeds VPP+|Vthp|. When the potential at terminal T1 further rises and exceeds VPP+|Vthp|, the current flows through P-channel MOS transistor TR1.

In other words, until the potential at terminal T1 exceeds Vpp+|Vthp|, no current flows from an impurity region 56 to an impurity region 58. Consequently, a parasitic capacitance C2 of an interconnection line W2 connected to impurity region 58 does not contribute to an input capacitance of terminal T1.

As described above, in the second embodiment like the first embodiment, the input capacitance of terminal T1 utilized for the test mode detection can be made to be about the same as the input capacitance of another terminal. In addition, the restriction of the position for disposing the SVIH circuit is eliminated. Thus, a semiconductor device can be realized that is capable of a high speed operation and of achieving layout optimization.

Third Embodiment

Figure 8:
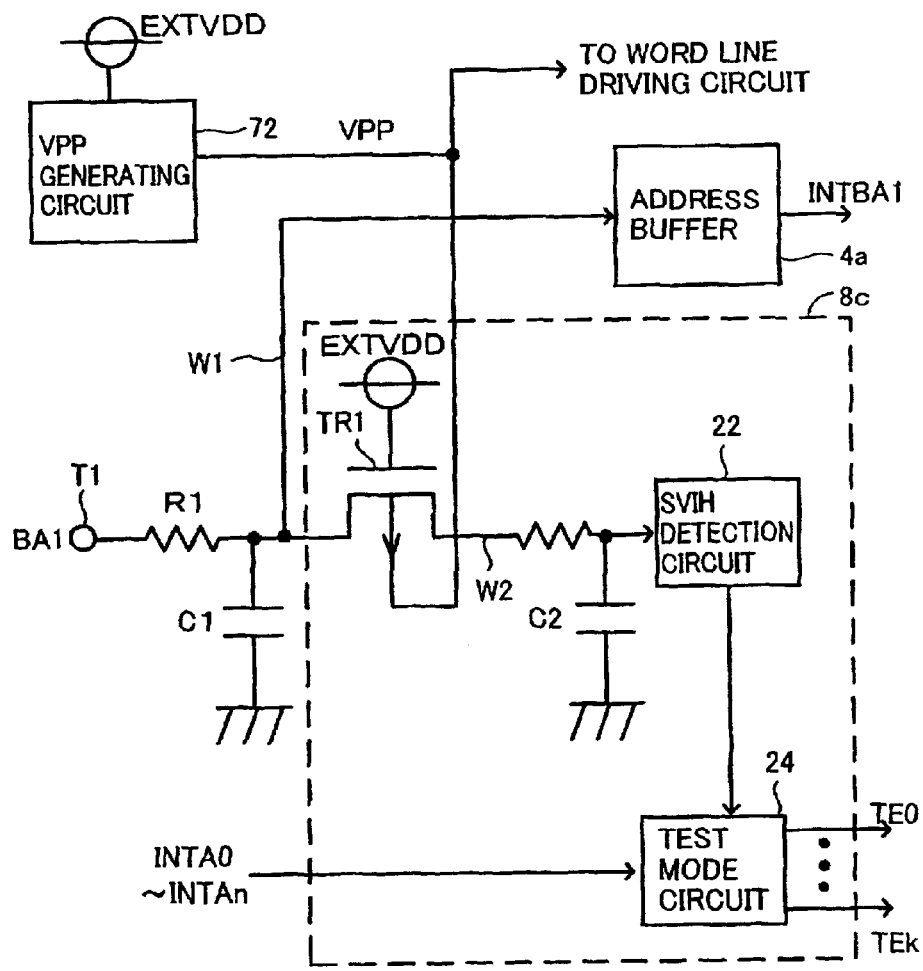
FIG. 8 is a schematic diagram related to the description of an arrangement for detecting the super VIH level of a semiconductor device according to a third embodiment.

FIG. 8 is a schematic diagram related to the description of an arrangement for detecting a super VIH level of a semiconductor device according to the third embodiment.

Referring to FIG. 8, the semiconductor device according to the third embodiment includes a control circuit 8c in place of control circuit 8b shown in FIG. 6. Control circuit 8c differs from control circuit 8b in that a gate of a P-channel MOS transistor TR1 receives a power-supply potential EXTVDD and a backgate is coupled to a boosted potential VPP. The arrangement of control circuit 8c in other portions is the same as that of control circuit 8b described with reference to FIG. 6 so that the description will not be repeated.

Figure 9:
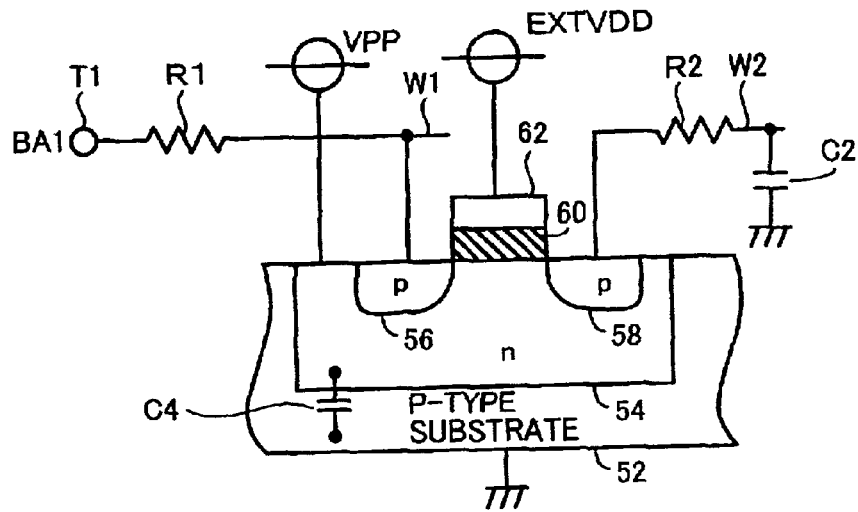
FIG. 9 is a cross sectional view related to the description of a P-channel MOS transistor TR1 of FIG. 8.
Figure 10:
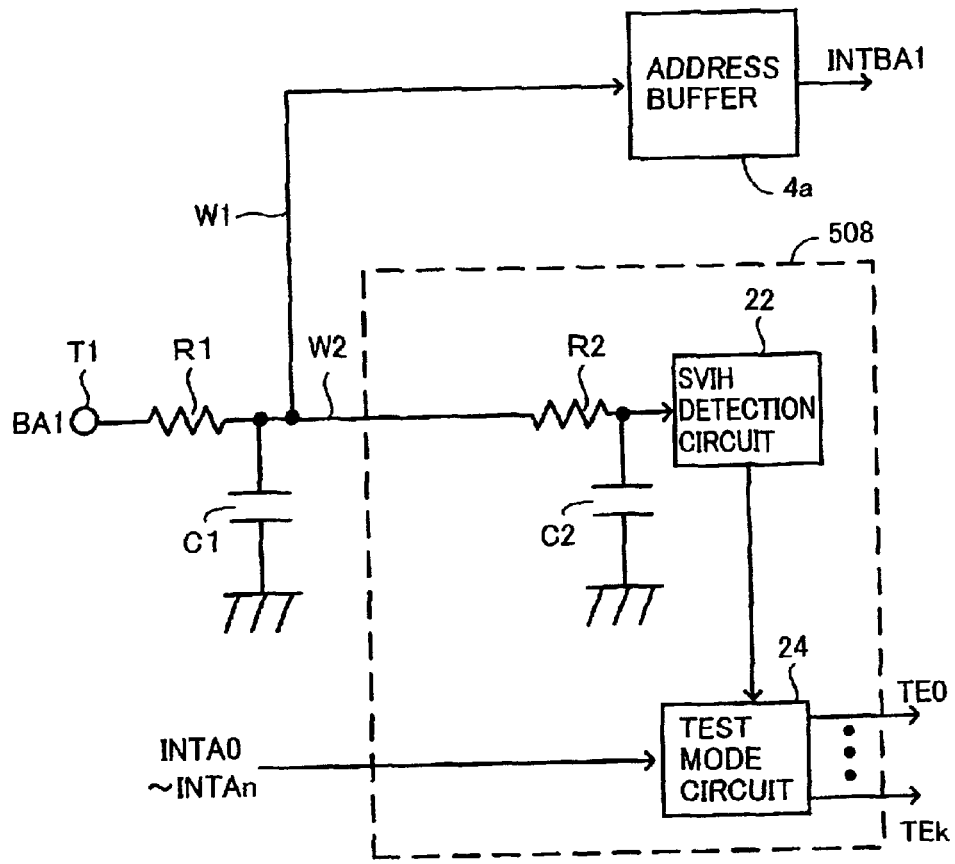
FIG. 10 is a schematic diagram related to the description of an arrangement for detecting the super VIH level of a conventional DDR SDRAM.

FIG. 9 is a cross sectional view related to the description of P-channel MOS transistor TR1 of FIG. 8.

Referring to FIG. 9, in the third embodiment, the gate of P-channel MOS transistor TR1 is coupled to power-supply potential EXTVDD. In addition, a well 54 is coupled to boosted potential VPP that is internally generated. Other portions are the same as in FIG. 7 so that the description will not be repeated.

A current does not flow through P-channel MOS transistor TR1 until a potential at terminal T1 exceeds EXTVDD+|Vthp|. When the potential at terminal T1 further rises and exceeds EXTVDD+|Vthp|, the current flows through P-channel MOS transistor TR1.

In other words, until the potential at terminal T1 exceeds EXTVDD+|Vthp|, no current flows from an impurity region 56 to an impurity region 58. Consequently, a parasitic capacitance C2 of an interconnection line W2 connected to impurity region 58 does not contribute to an input capacitance of terminal T1.

In addition, at this time, if the potential at terminal T1 is boosted potential VPP or below, a reverse bias is applied between p-type impurity region 56 and an n-well 54 so that a parasitic capacitance C4 between n-well 54 and a P-type substrate 52 can be disconnected from terminal T1. Thus, parasitic capacitance C4 that are added to the terminal input capacitance in the first and second embodiments can be further removed from the terminal input capacitance.

Moreover, if a potential that exceeds boosted potential VPP is applied to terminal T1, a forward current would flow from impurity region 56 to n-well 54. Therefore, the super VIH level which is a potential for setting to a test mode need to be set such that it does not exceed boosted potential VPP.

A semiconductor device that is capable of a high speed operation and of achieving layout optimization can be realized according to the third embodiment as well.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a normal mode and a test mode as operating modes, comprising:
   a terminal;
   an internal circuit for receiving a signal from said terminal;
   a test mode detection circuit for detecting that a voltage of said terminal is a test setting voltage higher than a power-supply voltage supplied to said semiconductor device;

a switch circuit provided between said terminal and said test mode detection circuit and rendered conductive when an input voltage of said terminal reaches a prescribed voltage higher than said power-supply voltage, for transmitting a signal according to the input voltage of said terminal to said test mode detection circuit;

a first interconnection line having a first capacitance, and connecting said terminal and said switch circuit to each other to transmit the input voltage of said terminal to said switch circuit; and a second interconnection line having a second capacitance larger than said first capacitance, and connecting said switch circuit and said test mode detection circuit to each other to transmit the voltage from said switch circuit to said test mode circuit.

2. The semiconductor device according to claim 1, wherein said switch circuit disconnects said second interconnection line from said first interconnection line when the input voltage of said terminal is lower than said prescribed voltage.

3. The semiconductor device according to claim 1, wherein said switch circuit includes a P-channel MOS transistor connected between said terminal and an input node of said test mode detection circuit and having a gate coupled to the power-supply voltage.

4. A semiconductor device having a normal mode and a test mode as operating modes, comprising:

a terminal;

an internal circuit for receiving a signal within a range of an input potential from said terminal in said normal mode;

a test mode detection circuit for detecting that a potential of said terminal is a test setting potential that is outside said range of the input potential when setting to said test mode; and a switch circuit provided between said terminal and said test mode detection circuit and rendered conductive when the potential of said terminal reaches a prescribed potential outside said range of the input potential, for transmitting a signal according to the potential of said terminal to said test mode detection circuit; wherein said switch circuit includes a P-channel MOS transistor connected between said terminal and an input node of said test mode detection circuit and having a gate coupled to a power-supply potential, and said test setting potential is a potential exceeding said power-supply potential; and wherein a backgate of said P-channel MOS transistor is coupled to said terminal.

5. A semiconductor device having a normal mode and a test mode as operating modes, comprising:

a terminal;

an internal circuit for receiving a signal within a range of an input potential from said terminal in said normal mode;

a test mode detection circuit for detecting that a potential of said terminal is a test setting potential that is outside said range of the input potential when setting to said test mode; and a switch circuit provided between said terminal and said test mode detection circuit and rendered conductive when the potential of said terminal reaches a prescribed potential outside said range of the input potential, for transmitting a signal according to the potential of said terminal to said test mode detection circuit; wherein said switch circuit includes a P-channel MOS transistor connected between said terminal and an input node of said test mode detection circuit and having a gate coupled to a power-supply potential, and said test setting potential is a potential exceeding said power-supply potential; and further comprising:

a boosted potential generating circuit that is boosted upon receiving said power-supply potential for generating a boosted potential, wherein a backgate of said P-channel MOS transistor is coupled to said boosted potential, and said test setting potential is a potential that does not exceed said boosted potential.

6. A semiconductor device having a normal mode and a test mode as operating modes, comprising:

a terminal;

an internal circuit for receiving a signal within a range of an input potential from said terminal in said normal mode;

a test mode detection circuit for detecting that a potential of said terminal is a test setting potential that is outside said range of the input potential when setting to said test mode; and a switch circuit provided between said terminal and said test mode detection circuit and rendered conductive when the potential of said terminal reaches a prescribed potential outside said range of the input potential, for transmitting a signal according to the potential of said terminal to said test mode detection circuit; and a boosted potential generating circuit that is boosted upon receiving a power-supply potential for generating a boosted potential, wherein said first switch circuit includes a P-channel MOS transistor having a gate coupled to said boosted potential and being connected between said terminal and an input node of said test mode detection circuit, and said test setting potential is a potential that exceeds said boosted potential.

7. The semiconductor device according to claim 6, wherein a backgate of said P-channel MOS transistor is coupled to said terminal.

8. The semiconductor device according to claim 1, wherein said internal circuit includes an input buffer circuit for receiving an input signal from said terminal, and a memory array for communicating data according to an output from said input buffer circuit, wherein said switch circuit disconnects said test mode detection circuit from a path leading from said terminal to said input buffer circuit when the input voltage of said terminal is lower than said prescribed voltage.

9. The semiconductor device according to claim 8, wherein said terminal is one of a plurality of terminals to which an address signal of said memory array is input.

10. A semiconductor device, comprising:

a terminal receiving an input signal;

an internal circuit receiving said input signal from said terminal;

a first interconnection line having a first length, and having an end connected to said terminal;

a switch circuit connected to the other end of said first interconnection line and rendered conductive when the voltage of said input signal is equal to or higher than a first voltage higher than an externally applied power supply voltage to transmit a second voltage in accordance with a voltage of said input signal;

a second interconnection line having a second length longer than said first length, having an end connected to said switch circuit and receiving said second voltage; and a voltage detection circuit connected to the other end of said second interconnection line and detecting said second voltage.

11. The semiconductor device according to claim 10, wherein said switch circuit disconnects said second interconnection line from said first interconnection line when the input voltage of said terminal is lower than said first voltage.

12. The semiconductor device according to claim 10, wherein said switch circuit includes a P-channel MOS transistor connected between said terminal and an input node of said test mode detection circuit and having a gate coupled to the power-supply voltage.

13. The semiconductor device according to claim 10, wherein said internal circuit includes an input buffer circuit for receiving an input signal from said terminal, and a memory array for communicating data according to an output from said input buffer circuit, where said switch circuit disconnects said voltage detection circuit from a path leading from said terminal to said input buffer circuit when the voltage of said input signal is within a range lower than said first voltage.

14. The semiconductor device according to claim 13, wherein said terminal is one of a plurality of terminals to which an address signal of said memory array is input.

* * * * *